United States Patent
Kuo (10) Patent No.: US 6,364,713 B1
(45) Date of Patent: Apr. 2, 2002

(54) ELECTRICAL CONNECTOR ADAPTER ASSEMBLY

(75) Inventor: Yu Jen Kuo, Tu-Chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 09/703,511

(22) Filed: Oct. 31, 2000

(30) Foreign Application Priority Data

May 23, 2000 (TW) ......................................... 089208741

(51) Int. Cl.[7] .............................................. H01R 31/06
(52) U.S. Cl. ........................ 439/638; 439/76.1; 439/79
(58) Field of Search ............................... 439/638, 76.1, 439/79, 75, 654, 650, 651, 655

(56) References Cited

U.S. PATENT DOCUMENTS

| | | | | |
|---|---|---|---|---|
| 4,076,356 A | * | 2/1978 | Tamburro .................... | 439/75 |
| 4,084,869 A | * | 4/1978 | Yen .............................. | 439/651 |
| 4,149,764 A | * | 4/1979 | Mattingly, Jr. ............... | 439/75 |
| 5,242,310 A | * | 9/1993 | Leung ......................... | 439/76.1 |
| 6,176,743 B1 | * | 1/2001 | Kuo ............................ | 439/638 |

* cited by examiner

*Primary Examiner*—Gary F. Paumen
(74) *Attorney, Agent, or Firm*—Wei Te Chung (57) ABSTRACT

An electrical connector adapter assembly (40) comprises a first dielectric housing (51), three sets of first terminals (52), (53), (54) retained in the first dielectric housing (51), a printed circuit board (PCB) (70), a set of conductors (80), a second dielectric housing (61) and two sets of second terminals (62) retained in the second dielectric housing (61). The PCB (70) has two sets of first circuit pads (71) and two sets of second circuit pads (72) in an upper and a lower surfaces (74), (75) thereof and a number of conductive devices (76) in the upper surface (74). Each conductor (80) has a first end (81) and a second end (82) electrically connecting a corresponding one of the uppermost set of first terminals (52) and a corresponding one of the conductive devices (76) of the PCB, respectively. The other two sets of first terminals (53), (54) are soldered to the two sets of first circuit pads (71) of the PCB (70), respectively and the two sets of second terminals (62) are soldered to the two sets of second circuit pads (72) of the PCB (70), respectively.

1 Claim, 7 Drawing Sheets

ELECTRICAL CONNECTOR ADAPTER ASSEMBLY

BACKGROUND OF THE INVENTION

1. Field of the Present Invention

The present invention relates to an electrical connector adapter assembly for electrically connecting one electronic device to another.

2. Description of the Prior Art

Figure 6:
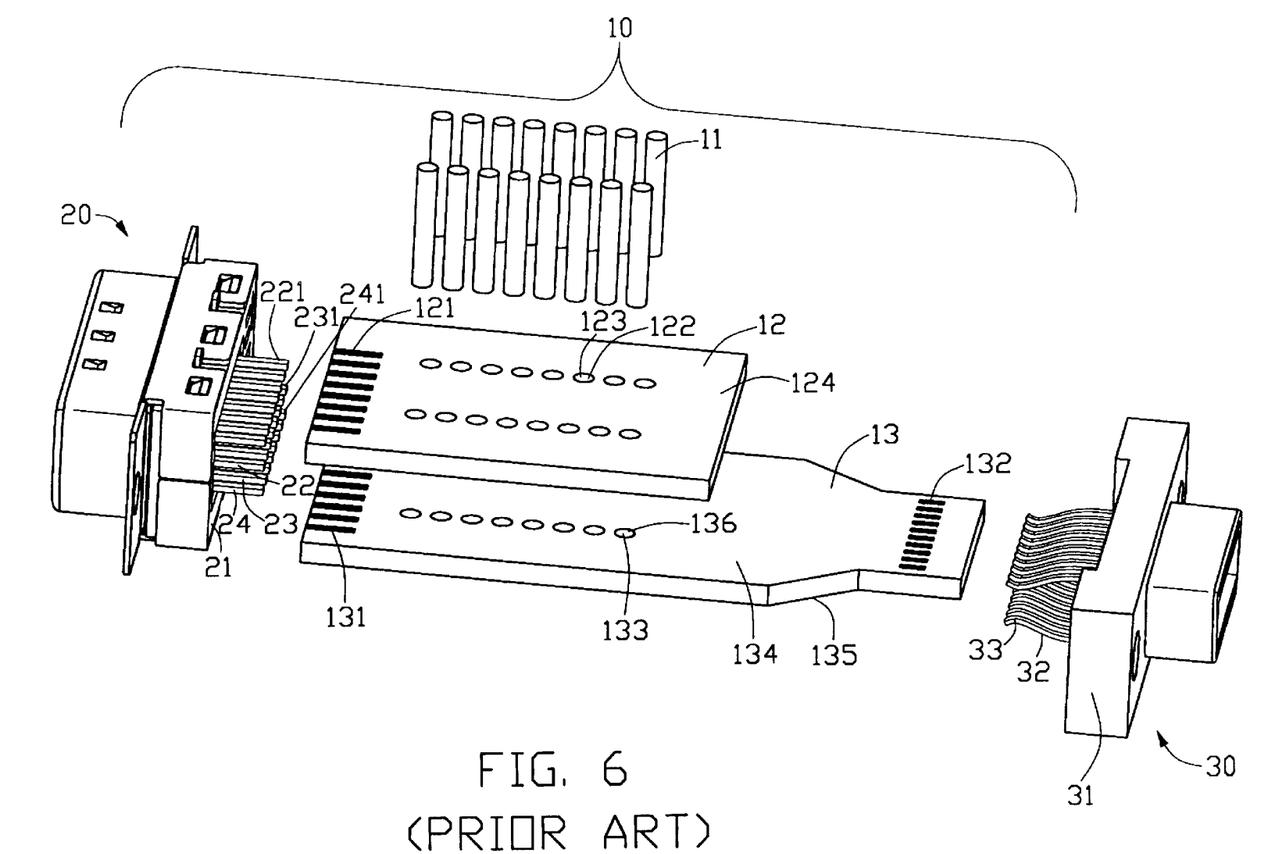
FIG. 6 is a partially exploded perspective view of a conventional electrical connector adapter assembly.
Figure 7:
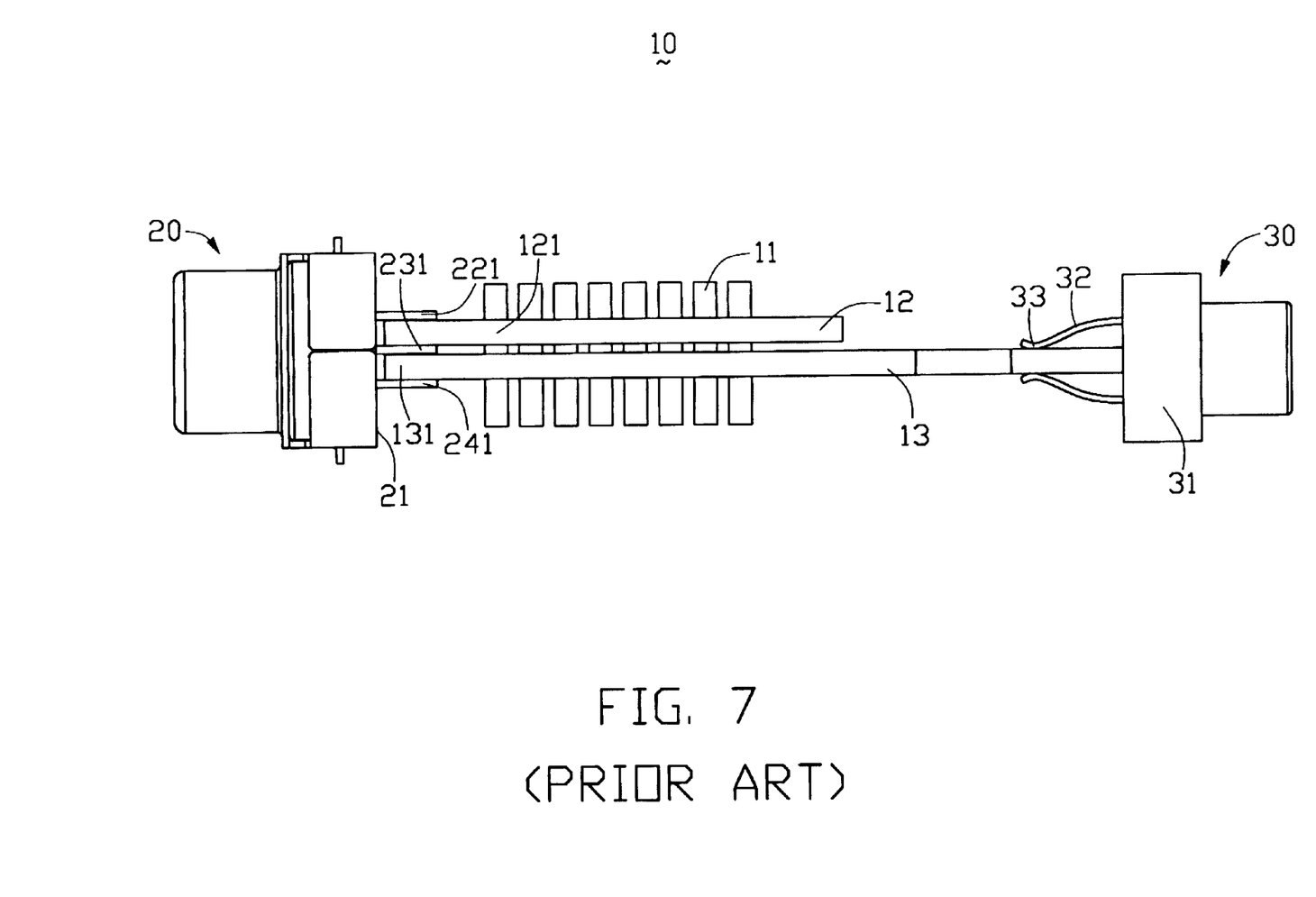
FIG. 7 is side planar view of the completely assembled conventional electrical connector adapter assembly of FIG. 6.

FIGS. 6 and 7 illustrate a conventional electrical connector adapter assembly 10 comprising a first connector 20, a second connector 30, a first and a second printed circuit boards (PCB) 13, 12 and a plurality of conductive poles 11. The first connector 20 comprises a first housing 21 and three sets of first terminals 22, 23, 24 retained in the first housing 21. Each of the first terminals 22, 23, 24 has a contact end 221, 231, 241. The second connector 30 comprises a second housing 31 and two sets of second terminals 32 retained in the second housing 31. Each of the second terminals 32 has a contact end 33. The first PCB 13 has a set of first circuit pads 131 and a set of second circuit pads 132 on each of an upper and a lower surfaces 134, 135 and defines a plurality of through holes 133 each connected with conductive devices 136. The second PCB 12 has a set of third circuit pads 121 on an upper surface 124 thereof and defines a plurality of through holes 122 each connected with conductive devices 123.

In assembly, the first connector 20 is mounted to the second PCB 12 and the first and the second connectors 20, 30 are mounted to the first PCB 13. The contact ends 221 of the uppermost set of the three sets of first terminals 22 are soldered to the set of third circuit pads 121 on the second PCB 12 using Surface Mounted Technology (SMT). The contact ends 231, 241 of the other two sets of first terminals 23, 24 are respectively soldered to the two sets of first circuit pads 131 of the first PCB 13 using SMT. The contact ends 33 of the two sets of second terminals 32 are respectively soldered to the two sets of second circuit pads 132 of the first PCB 13. Opposite ends of the conductive poles 11 are respectively soldered into the through holes 122 of the second PCB 12 and the through holes 133 of the first PCB 13 and electrically connect with the conductive devices 123, 136 in the through holes 122, 133.

The conventional electrical connector adapter assembly 10 has many disadvantages. First, the conventional electrical connector adapter assembly 10 has two PCBs 12, 13, which results in an expensive material cost. Second, soldering the conductive poles 11 into the through holes 122, 133 is relatively complex, thereby increasing the manufacturing cost of the conventional electrical connector adapter assembly 10. Third, it is difficult to find which of the inner set of first terminals 23 is not securely soldered to a corresponding first circuit pad 131 of the first PCB 13 and to repair it. Hence, an improved electrical connector is required to overcome the disadvantages of the prior art.

BRIEF SUMMARY OF THE INVENTION

A first object of the present invention is to provide an electrical connector adapter assembly manufactured at a lower cost;

A second object of the present invention is to provide an electrical connector adapter assembly which allows bad soldered joints to be easily found and repaired.

To fulfill the above objects, an electrical connector adapter assembly of the present invention comprises a first dielectric housing, three sets of first terminals retained in the first dielectric housing, a printed circuit board (PCB), a set of conductors, a second dielectric housing and two sets of second terminals retained in the second dielectric housing. The PCB has two sets of first circuit pads and two sets of second circuit pads on an upper and a lower surfaces thereof and a number of conductive devices in the upper surface. Each conductor has a first end and a second end electrically connecting a corresponding one of the uppermost set of the three sets of first terminals and a corresponding one of the conductive devices of the PCB, respectively. The other two sets of first terminals are soldered to the two sets of first circuit pads of the PCB, respectively and the two sets of second terminals are soldered to the two sets of second circuit pads of the PCB, respectively.

In a first embodiment of the present invention, the first ends of the conductors are soldered to contact ends of the uppermost set of first terminals and the conductive devices of the PCB are positioned in through holes defined in the PCB and the second ends of the conductors are soldered into the through holes.

In a second embodiment of the present invention, the conductive devices are plated in an upper surface of the PCB and the second ends of the conductors are soldered to the conductive devices using Surface Mounted Technology (SMT).

In a third embodiment of the present invention, the first ends of the conductors are laterally soldered beside the corresponding contact ends of the uppermost set of first terminals.

In a fourth embodiment of the present invention, the first ends of the conductors are coaxial with and confront the contact ends of the uppermost set of first terminals when they are soldered thereto.

Other objects, advantages and novel features of the invention will become more apparent from the following detailed description of the present embodiment when taken in conjunction with the accompanying drawings.

DETAILED DESCRIPTION OF THE INVENTION

Figure 1:
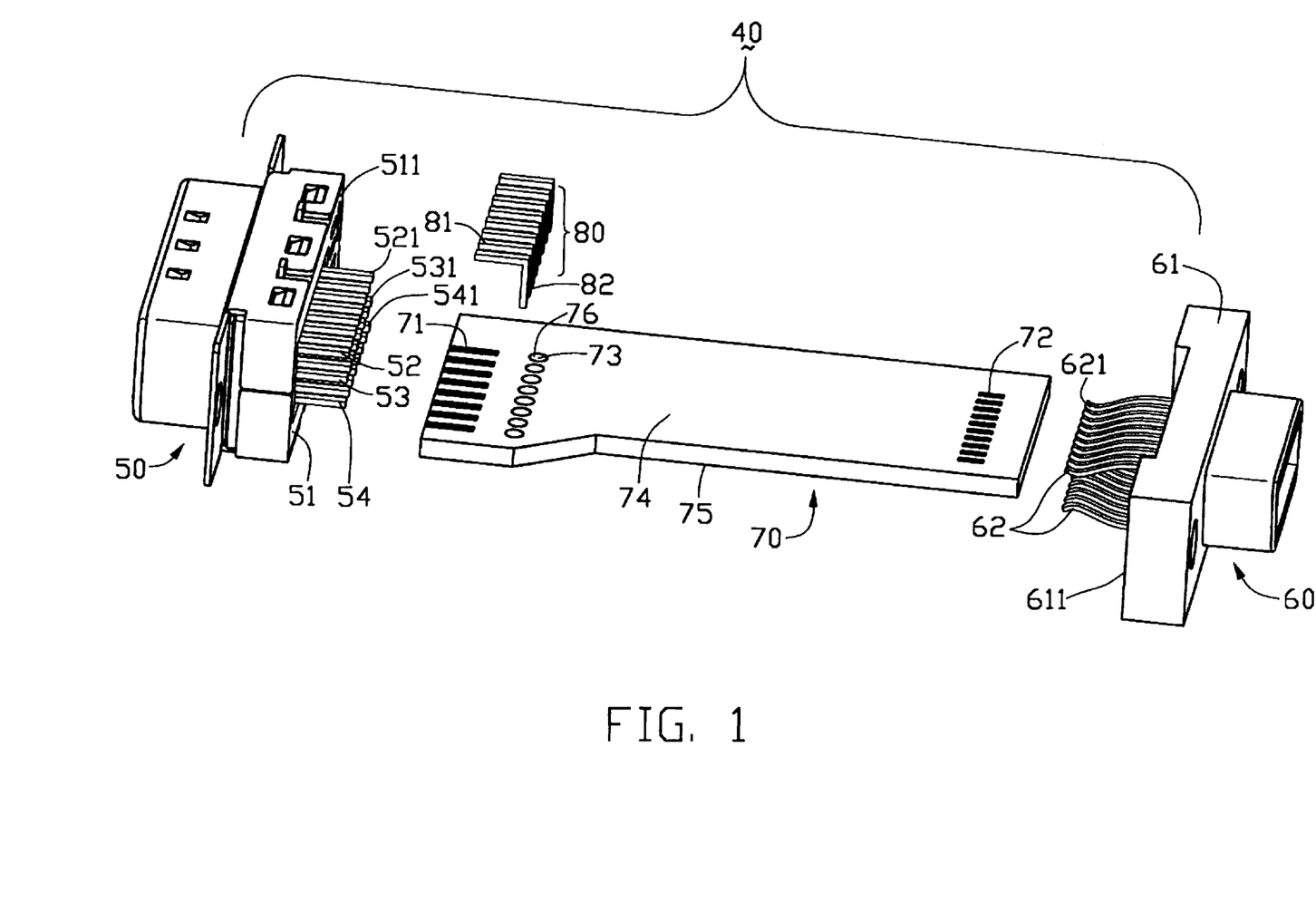
FIG. 1 is a partially exploded perspective view of an electrical connector adapter assembly in accordance with a first embodiment of the present invention.

Referring to FIG. 1, an electrical connector adapter assembly 40 of the present invention comprises a first electrical connector 50, a second electrical connector 60 and a printed circuit board (PCB) 70 on which the first and the second electrical connectors 50, 60 are mounted for transmitting signals therebetween, and a set of conductors 80.

The first electrical connector 50 comprises a first dielectric housing 51 and three sets of first terminals retained in the first dielectric housing 51. In order to facilitate description, the three sets of first terminals are respectively designated by a first, a second and a third sets of first terminals 52, 53, 54, wherein the first set of first terminals 52 are the uppermost set of the three sets of first terminals 52, 53, 54. Each of the first terminals 52, 53, 54 has a contact end 521, 531, 541 rearwardly extending beyond a rear face 511 of the first dielectric housing 51.

The second electrical connector 60 comprises a second dielectric housing 61 and two sets of second terminals 62 retained in the second dielectric housing 61. Each of the second terminals 62 has a contact end 621 rearwardly extending from a rear face 611 of the second dielectric housing 61.

The PCB 70 has a set of first circuit pads 71 and a set of second circuit pads 72 on each of an upper and a lower surfaces 74, 75 thereof and a number of conductive devices 76. The first circuit pads 71 and the conductive devices 76 are electrically connected to the corresponding second circuit pads 72 via a number of circuit routes (not shown) on the PCB 70. In a first embodiment of the present invention, the conductive devices 76 are positioned in a number of through holes 73 defined in the PCB 70.

Each conductor 80 is generally L-shaped and has a first end 81 and a second end 82 generally perpendicular to each other. The first ends 81 of the conductors 80 are soldered to the contact ends 521 of the uppermost set of first terminals 52 and the second ends 82 of the conductors 80 are soldered to the conductive devices 76 of the PCB 70, which is described in great detail below.

Figure 2:
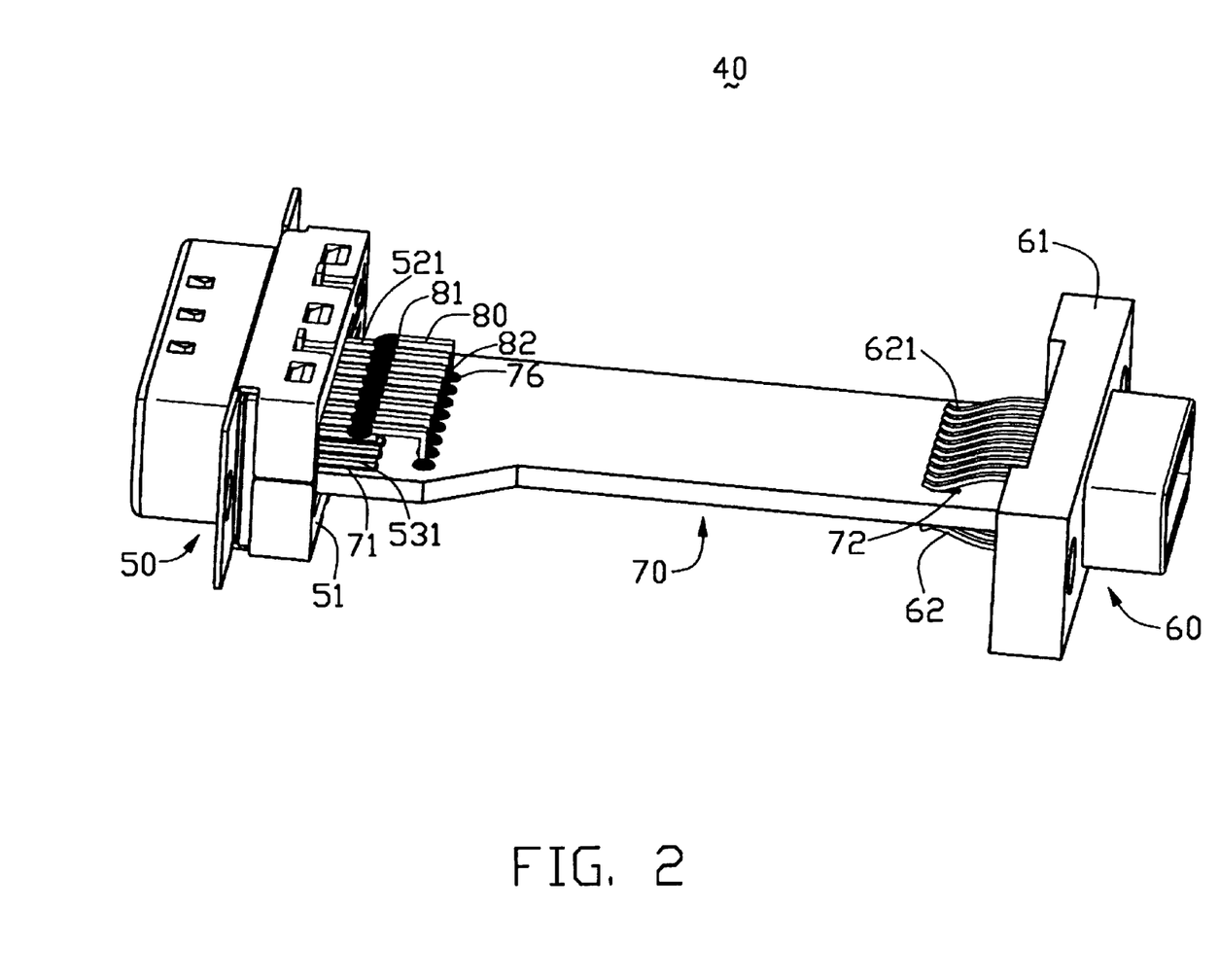
FIG. 2 is a completely assembled perspective view of FIG. 1.
Figure 3:
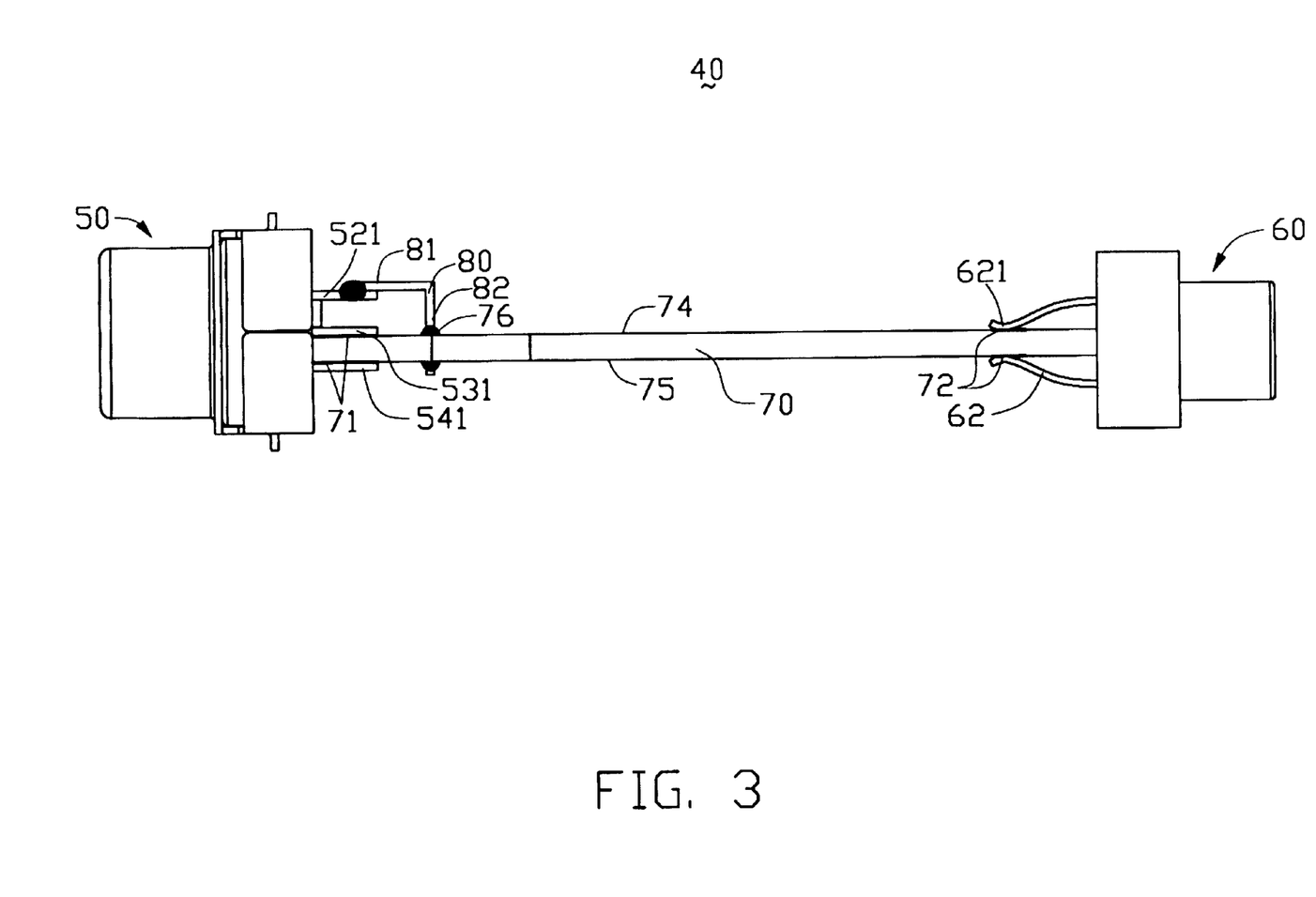
FIG. 3 is a side planar view of FIG. 2.

Referring to FIGS. 2 and 3, in assembly, the first and the second electrical connectors 50, 60 are mounted to the PCB 70. The contact ends 531, 541 of the second and the third sets of first terminals 53, 54 are soldered to the corresponding first circuit pads 71 on the upper and the lower surfaces 74, 75 of the PCB 70. The contact ends 621 of the two sets of second terminals 62 are soldered to the corresponding second circuit pads 72 on the upper and the lower surfaces 74, 75 of the PCB 70. The first ends 81 of the conductors 80 are soldered onto the corresponding contact ends 521 of the first set of first terminals 52. The second ends 82 of the conductors 80 are soldered into the corresponding through holes 73 and electrically connect the corresponding conductive devices 76 in the through holes 73.

Because the contact ends 531, 541 of the second and the third sets of first terminals 53, 54 are soldered to the first circuit pads 71 of the PCB 70 before the conductors 80 are soldered to the contact ends 521 of the uppermost set of first terminals 52, it is very convenient to find and repair bad solder joins between the first terminals 53, 54 and the first circuit pads 71. It is also very convenient to find out and repair bad solder joins between the upper set of first terminals 52 and the first ends 81 of the conductors 80. Further, since the conductors 80 are directly soldered to the uppermost set of first terminals 52 and to the conductive devices 76 of the PCB 70, a second PCB of the Prior Art is omitted herefrom, whereby the cost of the electrical connector adapter assembly 40 of the present invention is lower that the conventional assembly.

Figure 4:
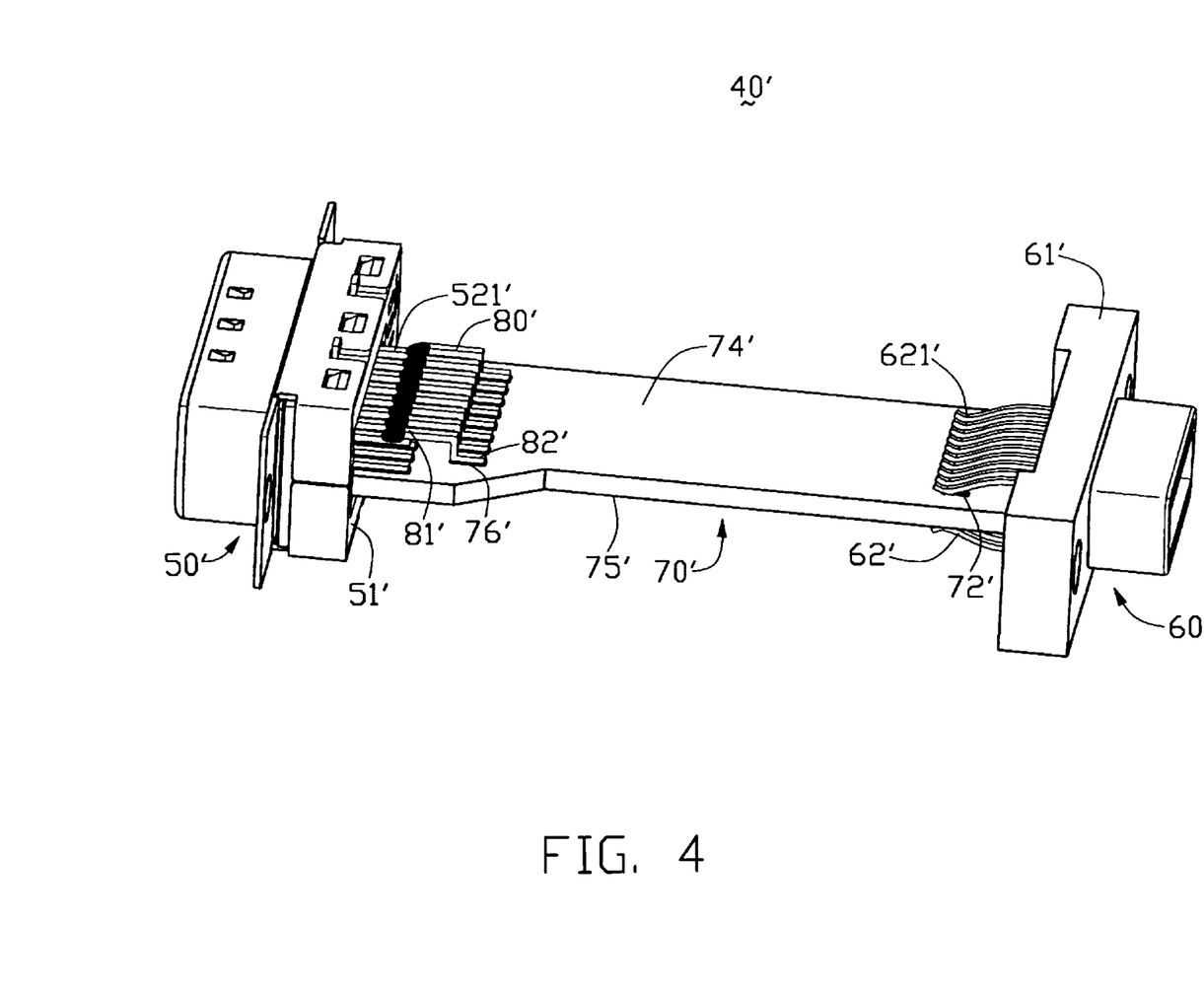
FIG. 4 is a perspective view of the completely assembled electrical connector adapter assembly in accordance with a second embodiment of the present invention.

Referring to FIG. 4, in a second embodiment of the electrical connector adapter assembly 40' of the present invention, the conductive devices 76' are plated on the upper surface 74' of the PCB 70'. Each conductor 80' has a first end 81' and a second end 82' parallel to each other and offset a predetermined distance from each other in a direction perpendicular to the upper surface 74' of the PCB 70'. The second ends 82' of the conductors 80' are soldered onto the corresponding conductive devices 76' using SMT. An advantage of the second embodiment over the first embodiment is that no through holes are drilled in the PCB 70' thereby preventing the PCB 70' from being damaged.

Figure 5:
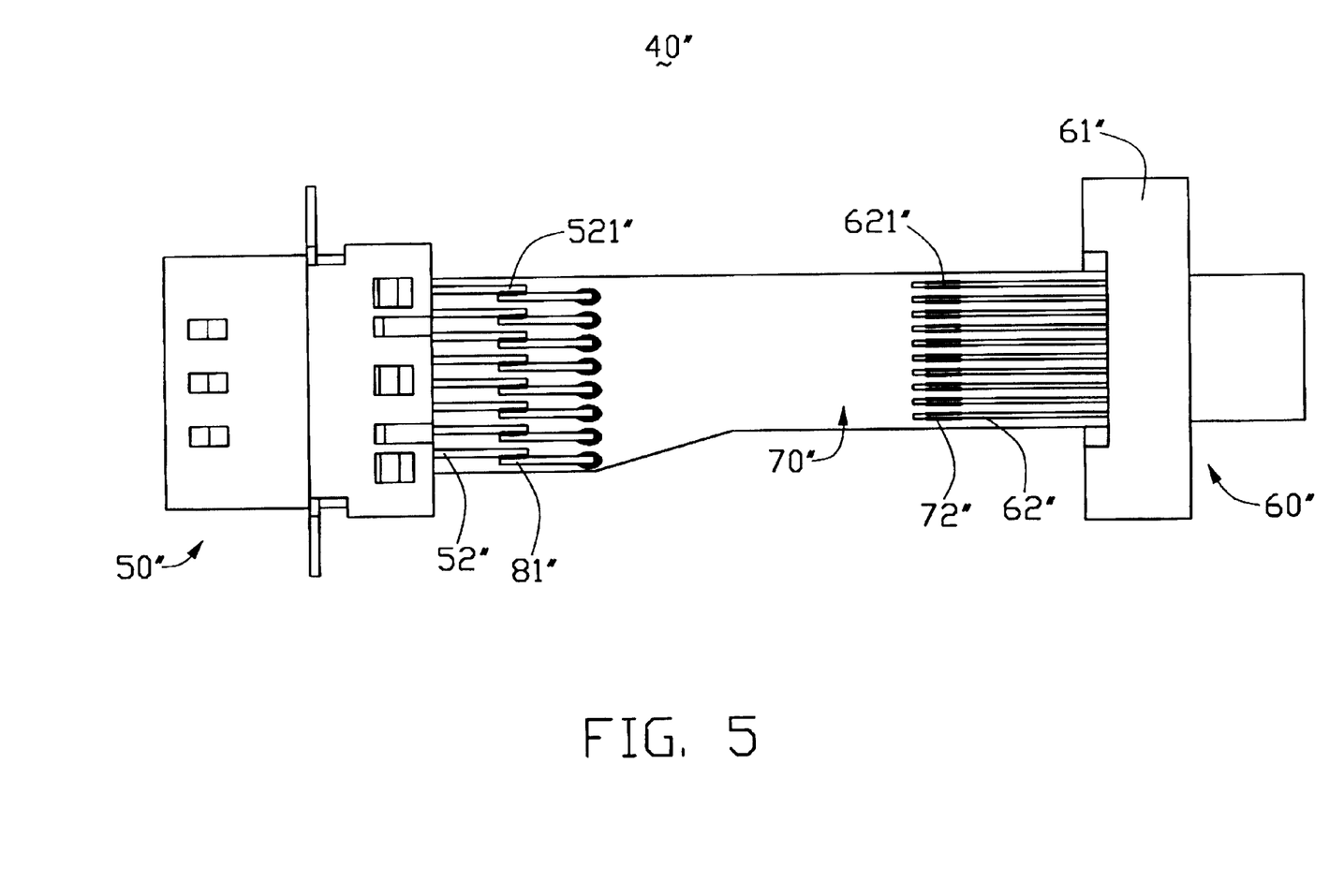
FIG. 5 is a top planar view of the completely assembled electrical connector adapter assembly in accordance with a third embodiment of the present invention.

FIG. 5 illustrates a third embodiment of the electrical connector adapter assembly 40" of the present invention wherein the first ends 81" are laterally soldered beside the corresponding contact ends 521" of the first set of first terminals 52" at a same level.

In other alternate embodiments of the present invention, the first ends 81 is soldered under the corresponding contact ends 521 of the first set of first terminals 52. When the three sets of first terminals 52, 53, 54 are arranged in such a high density that there is not enough space to receive the first ends 81 of the conductors 80, the first ends 81 of the conductors 80 may be coaxial with and confront the contact ends 521 of the first set of first terminals 52.

In the above description, the first electrical connector 50 comprises three sets of first terminals 52, 53, 54 and the PCB 70 has one set of first circuit pads 71 and one set of second circuit pads 72 on each of the upper and the lower surfaces 74, 75. However, in other variants of the assembly, the first electrical connector 50 may only have two sets of first terminals 52, 53 and the PCB 70 only one set of first circuit pads 71 and one set of second circuit pads 72 on the upper surface 74. This and similar variants should be considered within the scope of the disclosure of the present invention.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An electrical connector adapter assembly comprising:
   a first dielectric housing;
   a first and a second sets of first terminals retained in the first dielectric housing, each of the first terminals having a contact end;
   a printed circuit board (PCB) having a set of first circuit pads and, a set of second circuit pads on an upper surface thereof and a plurality of printed circuit routes between the sets of the first and the second circuit pads, the PCB further having a plurality of conductive devices, the set of first circuit pads and the conductive devices electrically connecting the corresponding set of second circuit pads via the plurality of printed circuit routes, the set of first circuit pads further electrically connecting the corresponding contact ends of the second set of first terminals;
   a set of conductors each having a first end and a second end, the first end of each conductor electrically connecting with a contact end of a corresponding first terminal of the first set of first terminals and the second end of each conductor electrically connecting with a corresponding conductive device of the PCB;
   a second dielectric housing; and
   a set of second terminals retained in the second dielectric housing, each second terminal having a second contact end electrically connecting with a corresponding second circuit pad of the PCB;

further comprising a third set of first terminals retained in the first dielectric housing and the PCB further comprising another set of first circuit pads on a lower surface thereof, wherein each of the third set of first terminals has a contact end soldered to a corresponding one of the another set of first circuit pads of the PCB;

wherein the first set of first terminals are the uppermost set of the three sets of first terminals.

* * * * *